United States Patent
Loeffler et al.

(10) Patent No.: US 8,063,458 B2
(45) Date of Patent: Nov. 22, 2011

(54) MICROMECHANICAL COMPONENT, METHOD FOR FABRICATION AND USE

(75) Inventors: Bernhard Loeffler, Gleisdorf (AT); Franz Schrank, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 592 days.

(21) Appl. No.: 11/918,189

(22) PCT Filed: Mar. 28, 2006

(86) PCT No.: PCT/EP2006/002815
§ 371 (c)(1),
(2), (4) Date: Mar. 10, 2008

(87) PCT Pub. No.: WO2006/105898
PCT Pub. Date: Oct. 12, 2006

(65) Prior Publication Data
US 2009/0014819 A1    Jan. 15, 2009

(30) Foreign Application Priority Data
Apr. 8, 2005   (DE) .......................... 10 2005 016 243

(51) Int. Cl.
*H01L 29/84* (2006.01)
(52) U.S. Cl. ................... 257/419; 257/E29.324; 438/52
(58) Field of Classification Search .............. 257/419, 257/E29.324; 438/52
See application file for complete search history.

(56) References Cited

U.S. PATENT DOCUMENTS

| | | | |
|---|---|---|---|
| 5,490,220 A | 2/1996 | Loeppert | |
| 5,777,328 A | 7/1998 | Gooch et al. | |
| 6,396,368 B1 * | 5/2002 | Chow et al. | 333/262 |
| 6,635,506 B2 * | 10/2003 | Volant et al. | 438/52 |
| 2003/0035192 A1 | 2/2003 | Mizuno et al. | |
| 2003/0116848 A1 | 6/2003 | Cunningham et al. | |
| 2004/0020303 A1 * | 2/2004 | Blomberg | 73/718 |
| 2004/0097003 A1 | 5/2004 | Kocis et al. | |
| 2004/0126921 A1 | 7/2004 | Volant et al. | |
| 2004/0145056 A1 * | 7/2004 | Gabriel et al. | 257/758 |
| 2004/0155306 A1 | 8/2004 | Lee et al. | |
| 2004/0159532 A1 * | 8/2004 | Tatic-Lucic et al. | 200/181 |
| 2005/0067633 A1 * | 3/2005 | Mushika | 257/202 |

FOREIGN PATENT DOCUMENTS

| | | |
|---|---|---|
| EP | 1 251 577 | 4/2002 |
| WO | WO 02/38491 A | 5/2002 |
| WO | WO 02/38491 A1 | 5/2002 |

* cited by examiner

Primary Examiner — Steven Fulk
(74) Attorney, Agent, or Firm — Cozen O'Connor (57) ABSTRACT

A micromechanical component that can be produced in an integrated thin-film method is disclosed, which component can be produced and patterned on the surface of a substrate as multilayer construction. At least two metal layers that are separated from the substrate and with respect to one another by interlayers are provided for the multilayer construction. Electrically conductive connecting structures provide for an electrical contact of the metal layers among one another and with a circuit arrangement arranged in the substrate. The freely vibrating membrane that can be used for an inertia sensor, a microphone or an electrostatic switch can be provided with matching and passivation layers on all surfaces in order to improve its mechanical properties, said layers being concomitantly deposited and patterned during the layer producing process or during the construction of the multilayer construction. Titanium nitride layers are advantageously used for this.

24 Claims, 4 Drawing Sheets

MICROMECHANICAL COMPONENT, METHOD FOR FABRICATION AND USE

RELATED APPLICATIONS

This is a U.S. national stage of application No. PCT/EP2006/002815, filed on 28 Mar. 2006.

This patent application claims priority of German patent application No. 10 2005 016 243.6, filed Apr. 8, 2005, the disclosure content of which is hereby incorporated by reference.

FIELD OF THE INVENTION

The invention relates to a micromechanical component, in particular of MEMS design (Micro Electro Mechanical System), which is produced in miniaturized fashion by means of thin-film methods on the surface of a substrate, and to the use of said component.

BACKGROUND OF THE INVENTION

An MEMS component formed as a microphone is known for example from U.S. Pat. No. 5,490,220 A. In order to produce such a microphone, a thin-film construction comprising at least one membrane embedded into the thin-film construction is produced on a substrate. Said membrane is freed from its embedding in a later method step by virtue of the sacrificial layers that envelop or enclose it being removed by etching.

The functional principle of many MEMS components is based on a capacitor the capacitance of which varies with a deflecting membrane. Accordingly, alongside the electrically conductive membrane, a further conductive layer is also provided as counterelectrode on the substrate, which can be realized within the same layer construction.

Integrated circuits in the form of semiconductor components are required for the electrical signal processing of such an MEMS component, known MEMS components typically being incorporated into a common package with an IC component and thus constituting hybrid components. A further possibility consists in integrating an MEMS component together with an IC component in a module or producing the MEMS component directly on an IC component or connecting it to such a component.

US 2004/0155306 A1 discloses an MEMS component comprising a freely vibrating metallic membrane that is separated by an air gap from an operating electrode arranged underneath on the substrate. For production purposes, firstly a sacrificial layer is produced above the substrate and patterned in such a way that at least one connection region for the membrane is exposed in the substrate. The membrane is subsequently produced over a large area and patterned. Through a hole pattern present in the membrane, the sacrificial layer is etched away underneath, the air gap arising.

US 2004/0126921 A1 discloses an MEMS switch in which a metallic membrane is tensioned above switching and drive electrodes on a substrate in a manner separated by an air gap. The electrical connection of the membrane to a circuit arrangement arranged in the substrate is effected by means of vias produced in a dielectric layer by etching and filling with metal. The air gap below the membrane is produced by etching a sacrificial layer through the membrane provided with a hole pattern. The air gap and hence the distance between the membrane and the drive and switching electrode is set by varying the thickness of the dielectric layer on which the membrane bears on one or both sides.

In the case of MEMS components, the problem generally occurs that the layer construction comprising different material layers, for the MEMS component, can have stresses which are caused by production or generated thermomechanically and which adversely affect the mechanical behaviour of the membrane. Added to this is the fact that MEMS components are preferably produced by means of standardized thin-film methods. An unfavourably strained membrane can lead to a malfunction and an excessively small air gap can lead to a total failure of the MEMS component.

SUMMARY OF THE INVENTION

It is an object of the present invention to specify a micromechanical and, in particular an MEMS component which is improved with regard to the disadvantages mentioned above.

This and other objects are attained in accordance with one aspect of the present invention directed to a micromechanical component, comprising a substrate; at least one electrical circuit arrangement in or on said substrate; a first stack applied on said substrate, wherein said first stack includes a multilayer construction comprising an alternate sequence of patterned metal layers and interlayers, and having at least two of said metal layers; wherein a metal layer of said multilayer construction other than the bottommost metal layer is lengthened beyond said first stack at one side and comprises a freely vibratable, electrically conductive membrane.

A micromechanical component is integrated with a freely vibrating membrane into a multilayer construction that exhibits a lower mechanical strain and an improved thermomechanical behaviour. For this purpose, a multilayer construction is proposed which has an alternate sequence of patterned metal layers and interlayers, at least two metal layers being provided. From the multilayer construction, a stack is patterned in which, above a lower metal layer, one of the overlying metal layers is lengthened beyond the stack at one side and thus forms a freely vibrating membrane. Within the meaning of the invention, membrane shall also be understood to encompass a deflectable beam.

The multilayer construction can comprise metal layers and interlayers having an identical thickness in each case. However, it is also possible to vary the individual layers in particular with regard to the layer thickness in order to compensate for thermal strains. A contribution is also made to the improved mechanical properties of the micromechanical component by the fact that, by way of the number of alternate metal layers and interlayers, there is a further possibility of varying the height of the stack, the distance between the membrane and the substrate surface, the stability of the stack and the strain within the stack across a large range and therefore optimizing them.

The stack with the multilayer construction is arranged on a substrate, in which at least one electrical circuit arrangement is provided. The electrical linking of the membrane embodied as a metal layer is achieved by means of the interlayers, which, in one embodiment, comprise a dielectric into which electrically conductive connecting structures and in particular VIAS are embedded. Alongside the electrical connection of the individual metal layers, which therefore also guarantees the electrical connection thereof to the circuit arrangement in the substrate, the connecting structures additionally provide a structural reinforcement of the multilayer construction which has a high mechanical stability in conjunction with low thermomechanical strain.

The circuit arrangement in the substrate can comprise an integrated circuit. In particular, the substrate can be an IC component, on the surface of which are arranged electrodes and the multilayer construction for the micromechanical component. The IC component can comprise an integrated circuit arrangement designed for the electrical driving of the micromechanical component, the evaluation of electrical signals of a component formed as a sensor, and the drive and switching functions for a micromechanical component formed as an MEMS switch.

The micromechanical component can be constructed for example by means of standard thin-film methods such as are used in CMOS technology. Standard layer thicknesses can be produced, in which case the height dimension of the component can advantageously be optimized by way of the number of alternate layers in the multilayer construction. The membrane can be, in the multilayer construction, for example the third or fourth metal layer above the substrate. Above this metal layer lengthened to form the membrane, the multilayer construction can comprise further alternate layers. It is advantageous, for example, to arrange the metal layer lengthened to form the membrane at a position in the multilayer construction which is symmetrical in the stack at least with regard to the mass loadings and/or the thermomechanical strains above and below said metal layer. A symmetrical or at least equalizing mass loading can also be achieved by one or a plurality of the layers arranged above the membrane metal layer being made thicker than those arranged below the membrane metal layer.

It is advantageous to embed at least the metal layer lengthened to form the membrane between an upper and a lower passivation layer, in order to protect it in particular against the concluding etching process for uncovering the membrane. Furthermore, the passivation layer can serve for protecting the membrane from corrosion. The passivation layer can also serve for setting the mechanical prestress of the membrane or for compensating for an undesirable prestress caused by production. For this purpose, the thickness of the passivation layers can be varied and in particular different thicknesses can be set for the lower and the upper passivation layer. It is also possible to introduce additional matching layers between membrane and passivation layer. In this case, it is possible, in conjunction with the layer thickness of the passivation layers being uniform and remaining the same, to vary only the thickness of one or both matching layers.

The membrane advantageously has a pattern of perforations. This makes it possible to construct the multilayer construction including the metal layer lengthened to form the membrane as a compact composite and only afterwards to uncover the air gap between membrane and substrate surface in an etching step, which is conducted through the hole pattern within the membrane.

A micromechanical component can have an individual stack in which the membrane constitutes a lengthened metal layer. The membrane can then be formed in reed-type fashion, in which case the free end of the reed can vibrate freely. It is also possible to provide a second stack, the membrane likewise preferably being formed in reed-type fashion and being with both ends an integrated part of the respective stack. A membrane which is fixed only on one side and integrated into a stack has the advantage that it requires a lower deflection force than a membrane which is fixed on both sides in a stack.

In a further embodiment of the invention, the membrane spans a cavity within a stack. In this case, it is fixed along its entire outer periphery within this one stack. This embodiment has the advantage that the air gap between membrane and substrate surface is a closed cavity, the filling of which can be controlled. It is possible, for example, to set a specific pressure in said cavity, which pressure can be higher or lower than the ambient pressure. It is also possible to fill the cavity with a specific and preferably inert gas.

A further configuration of a micromechanical component comprises a reed-type membrane which is fixed only on one side in a stack and which has a mass loading at its free end. This can be a mass loading with one or more additional layers which are applied exclusively at the free end on the membrane. It is also possible to provide said additional mass loading on a layer plane below the membrane but connected to the membrane. Said mass loading makes it possible to influence the mechanical properties of the membrane and set them to a desired value. If the mass loading is provided below the membrane, then the air gap can thereby be reduced. Preferably, the layers required for the mass loading are also provided with a hole pattern in order to provide the air gap underneath by etching away a sacrificial layer applied underneath.

The mass loading can also be applied in the form of a multilayer construction, preferably with the same construction as the multilayer construction in the stacks. This enables an integrated production of the mass loading together with the patterning of the stack.

In one embodiment, all metal layers in the stacks have a passivation at their lateral edges. Said passivation can be embodied in the form of a dielectric which is produced and patterned in the case of the stack construction for each metal layer. It is also possible to provide an insulation arranged at the entire sidewalls of the stacks. Such an insulation can be produced for example in the form of spacer structures by virtue of an auxiliary layer being deposited in edge-covering fashion with corresponding thickness and being etched back anisotropically, the spacers remaining exclusively at vertical structure edges.

The materials for the multilayer construction, that is to say dielectric, membrane and passivation layer, if appropriate, are preferably compatible with the CMOS process. Suitable dielectrics are selected for example from an oxide, a nitride, or an oxynitride. Titanium nitride constitutes the preferred material used for the passivation layer. It has very good passivation properties, can be patterned well and can be etched selectively with respect to oxide. This point is particularly important since oxide which can advantageously be etched selectively with respect to the passivation layer is used as preferred sacrificial layer. A selective etchability with respect to the dielectric of the interlayer is likewise advantageous.

Suitable for the metal layers of the multilayer construction are any electrically conductive metals that can be produced well by means of thin-film methods, in particular the aluminium and copper already used in CMOS technology.

The component can be provided with a covering above the membrane at a distance from the latter. The covering can terminate with the stack and is preferably drawn up to the surface of the substrate. It is thus possible to provide an air- and moisture-tight embedding of the component. However, it is also possible to provide continuous holes or openings in the covering, such that although a mechanical protection of the membrane is afforded, an exchange with the ambient air and hence also a pressure equalization are nevertheless possible. Such a covering can be used for components configured as pressure sensors or else as a micromechanical microphone.

The freely vibrating membrane of the component serves for picking up a force, a pressure difference or a vibration and reading it by means of an electrical parameter that varies with the reduced distance between the membrane and the surface of the substrate. If appropriate, the desired measured value can be output after a linearization by means of a, circuit arrangement, for example by means of an integrated circuit.

The micromechanical component preferably operates capacitively, in which case a capacitance between the membrane and a counterelectrode arranged on the surface of the substrate varies as a result of deflection of the membrane.

However, it is also possible to embody the component as a micromechanical switch. In this case, provision may be made for providing a drive electrode on the surface of the substrate, which electrode can be used to bring about a deflection of the membrane for example by means of electrostatic attraction. If the deflection is effected as far as a flip-over point, the electrostatic attraction dominates over the restoring force and the membrane closes the contact, the switch being closed.

Applications which supply a measurement signal proportional to the deflection of the membrane are for example acceleration sensors such as are used for example in modern motor vehicles, for navigation devices and safety-technological devices.

The invention is explained in more detail below on the basis of exemplary embodiments and the associated figures. The figures have been drawn up only schematically and not as true to scale, such that neither absolute nor relative dimensions can be inferred from the figures. Identical or identically acting parts are designated by the same reference symbols.

DETAILED DESCRIPTION OF THE DRAWINGS

Figure 1:
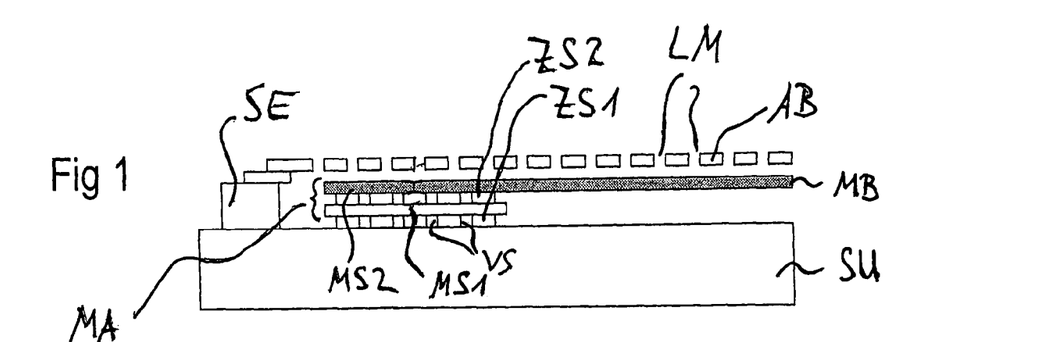
FIG. 1 shows in schematic cross section a micromechanical component with a multilayer construction comprising two interlayers and two metal layers.

FIG. 1 shows a portion of a simple embodiment of a micromechanical component. The latter is constructed on a substrate SU, which comprises a circuit arrangement IC (not illustrated) and is for example itself an IC component. The micromechanical part of the construction is realized in a multilayer construction MA, which in FIG. 1 comprises a first interlayer ZS1, a first metal layer MS1, a second interlayer ZS2 and a second metal layer MS2. Each metal layer can per se in turn comprise a plurality of layers and additionally have passivation and stress compensation layers at the top and/or at the bottom. The second metal layer MS2 laterally projects beyond the stack of the multilayer construction and is lengthened to form a membrane MB, which is separated from the surface of the substrate SU by an air gap. In the case of an application of the component as a sensor, said air gap represents the maximum deflection of the membrane. If the component is used as a switch, then the air gap corresponds to the switch path.

A covering AB is arranged at a distance above the membrane MB, which covering has in this case a hole pattern and is formed from a dielectric material, preferably from silicon nitride. The covering rests either on the stack or, as illustrated in the figure, on supporting elements SE which, likewise in a manner patterned by means of thin film, are arranged laterally with respect to the stack or the multilayer construction MA.

The electrical connection of the circuit arrangement in the substrate to the metal layers and in particular to the membrane MB is effected by means of connecting structures VS, which constitute for example in cross section round holes or vias through the interlayer and are formed in particular from tungsten. A contact area for the electrical connection of the membrane is provided (not illustrated) on the surface of the substrate below the multilayer construction. Furthermore, at least one sensor or switching electrode is arranged in the region of the air gap, said electrode serving for capacitively picking up a measured value or for producing a mating contact for a component used as a switch.

Figure 2:
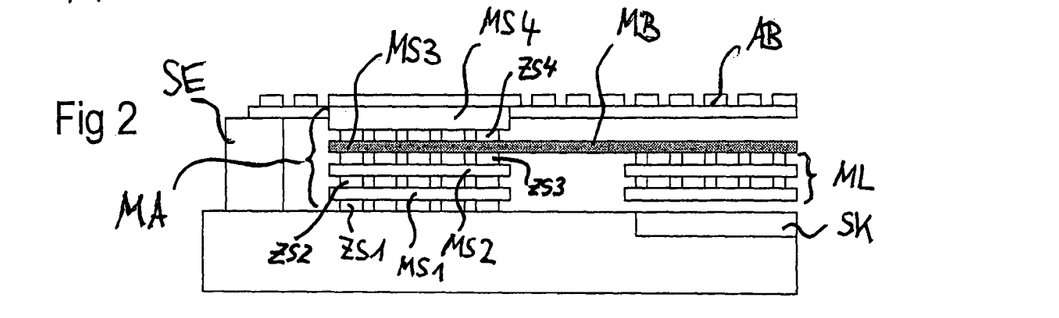
FIG. 2 shows a component with four metal layers, and a mass loading on the membrane.

FIG. 2 shows a portion of a further embodiment of the invention. In contrast to the embodiment according to FIG. 1, the multilayer construction is continued above the metal layer MS3 lengthened to form the membrane MB, here by a further interlayer ZS4 and a further metal layer MS4. By continuing the multilayer construction above the metal layer MS3, it is possible to compensate for stresses acting on the membrane within the multilayer construction MA since the construction is embodied more symmetrically in the vertical direction with respect to the membrane.

Furthermore, in this case a mass loading ML is arranged at the free end of the membrane MB, said mass loading in this case being realized below the membrane as a further multilayer construction but with a smaller number of layers in the construction. However, it is also possible to arrange the mass loading ML alternatively or additionally above the membrane, in which case it can then have overall a larger number of individual layers than the multilayer construction. In the first case, an air gap still remains between the mass loading ML and the surface of the substrate, said air gap enabling a deflection of the membrane in the direction of the substrate, in which case, in an application as a switch, it is possible to produce an electrical contact to a switching contact SK arranged on the surface of the substrate SU. A metallization which acts purely capacitively and which has no direct electrical contact with the membrane even in the event of deflection is also possible. Switching contact or capacitively acting metallization are of course also provided in the embodiment according to FIG. 1, but are not explicitly illustrated there.

A covering AB is illustrated in this case as well, which covering can bear on the multilayer construction or on the topmost layer thereof. In contrast to the exemplary embodiment according to FIG. 1, the covering originally provided with a hole pattern is closed. In this case as well, lateral supporting elements SE can be provided which can be led all around the entire multilayer construction and the membrane and can therefore constitute together with the covering AB a housing for the micromechanical multilayer construction.

Figure 3:
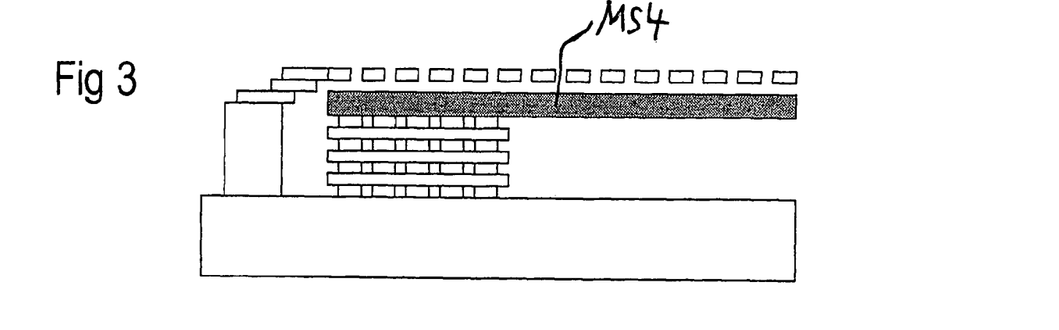
FIG. 3 shows a component with four metal layers, in which the topmost layer is formed as a membrane.

FIG. 3 illustrates a portion of a further exemplary embodiment in schematic cross section, in which the fourth metal layer MS4 counted proceeding from the substrate is lengthened to form the membrane. As illustrated, the membrane can have a larger layer thickness than the rest of the metal layers MS1 to MS3 used in the multilayer construction. In this way, too, a membrane which is freer of strain is obtained, even if said membrane, as here, is realized as the topmost layer of the multilayer construction. The covering is arranged at a clear distance from the membrane and provided with a hole pattern. The latter guarantees that, on the one hand, an air pressure equalization can be effected and that, on the other hand, the membrane can be etched free by stripping out sacrificial layers. Said sacrificial layers are concomitantly produced during preceding method steps in the course of production, such that a compact layer construction without interspaces is always provided. For the purpose of etching free the air gap below the membrane, an etchant access to the later air gap is likewise provided, for example through a further hole pattern within the freely vibrating end of the membrane.

Figure 4:
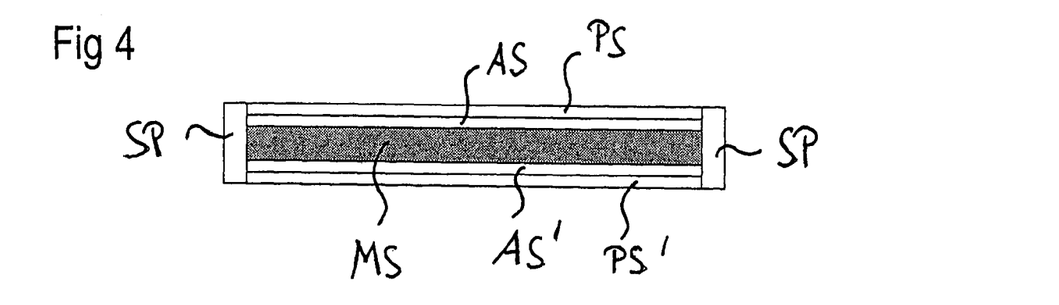
FIG. 4 shows a membrane in schematic cross section.

FIG. 4 shows a further configuration on the basis of a schematic cross section through a membrane, which configuration represents a membrane which, on the one hand, is protected against etching attacks and, on the other hand, is improved and optimized in terms of its mechanical properties. At least one upper passivation layer PS and one lower passivation layer PS' are provided above and below the metal layer MS forming the core of the membrane. Said passivation layers in each case comprise an inert material that is resistant to the etchant used for etching away the sacrificial layers. A mechanical matching can already be effected by means of a suitable layer material and a for example different choice of the layer thicknesses for upper and lower passivation layer PS. However, it is also possible to provide a respective upper and lower matching layer AS, AS' between passivation layer PS and metal layer MS. Given an identical layer thickness of upper and lower passivation layer, the matching can be effected by varying the layer thickness of the matching layer on one side or on both sides. It is also possible to produce such a matching layer only on one side.

In the embodiment illustrated, the membrane is protected on both sides by a lateral passivation SP, which represents one possible but not necessary configuration of the invention. Said lateral passivation can also be produced in the form of a spacer structure.

Figure 5:
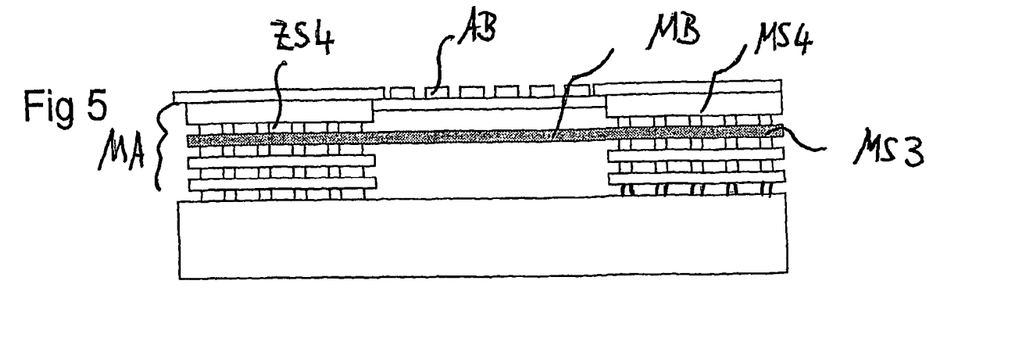
FIG. 5 shows a component with a membrane braced between two stacks.

FIG. 5 shows a further configuration of a micromechanical component, in which the membrane MB is realized as third metal layer MS3 in the multilayer construction, which is patterned to form two stacks between which the membrane MB is braced. The membrane is mechanically stabilized by the bracing at both ends. Above the third metal layer MS3, the multilayer construction is also extended by an interlayer ZS4 and an upper metal layer MS4. The covering AB is formed in closed fashion in this case and bears directly on the topmost metal layer MS4.

Figure 6:
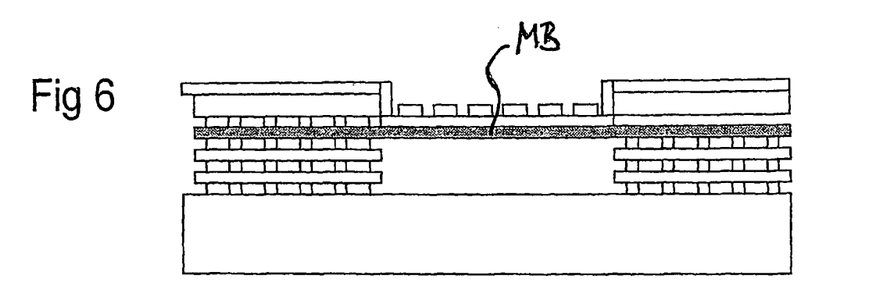
FIG. 6 shows a variant with a covering bearing directly on the membrane.

FIG. 6 shows a similar construction to FIG. 5 with the difference that here the covering bears directly on the metal layer MS3 functioning as membrane MB.

FIGS. 5 and 6 do not illustrate an encapsulation of the multilayer construction, which can be achieved for example as in FIG. 1 by means of supporting elements or covering layers drawn up to the surface of the substrate.

Figure 7:
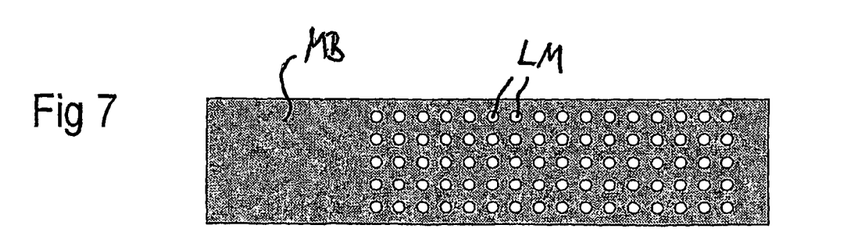
FIG. 7 shows a membrane in plan view.

FIG. 7 shows a metal layer used as a membrane in plan view. The membrane has a continuously closed part which is part of a multilayer construction. In the freely vibrating part projecting beyond the stack of the multilayer construction, the membrane is provided with a hole pattern LM. The latter serves to provide free access for the etchant to an underlying sacrificial layer to be stripped out, in order thus to produce the air gap. For embodiments according to FIG. 5 or 6, a further region without a hole pattern is provided on the right-hand side in order that the membrane can be clamped into a stack at both ends.

Figure 8:
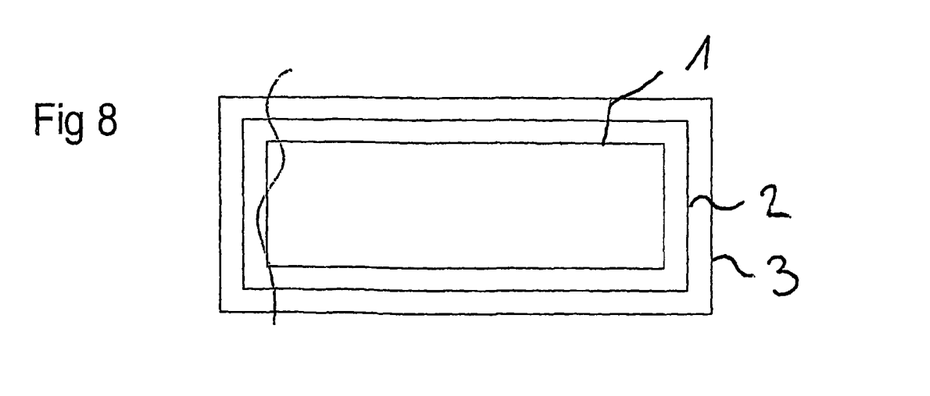
FIG. 8 shows a membrane with matching and passivation layers in schematic plan view.

FIG. 8 shows a possible arrangement of passivation layers in that region of the membrane which is provided with a hole pattern. The innermost area, designated by 1, corresponds to the outer dimensions of the freely vibrating part of the membrane that is provided with a hole pattern. The area 2 shows the dimensions of upper and lower passivation layer, likewise provided with a hole pattern in the region in order to enable access for the etchant to underlying layers. A third area 3 indicates a region of the passivation layer which is not provided with a hole pattern. However, it is also possible for the regions 2 and 3 to be identical in terms of size.

The production of a micromechanical component is explained below with reference to FIG. 9 by means of various method stages illustrated schematically.

Proceeding from a substrate SU with a circuit arrangement integrated therein, firstly a first interlayer ZS1 is produced. In the region of the stack to be patterned from this later, openings OE are produced in the interlayer ZS1, the surface of the substrate SU being uncovered in said openings (see FIG. 9A).

Figure 9A:
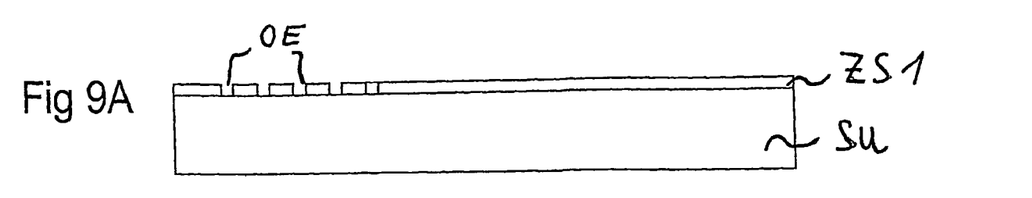
FIGS. 9A to 9J show various method stages during the production of a component.
Figure 9B:
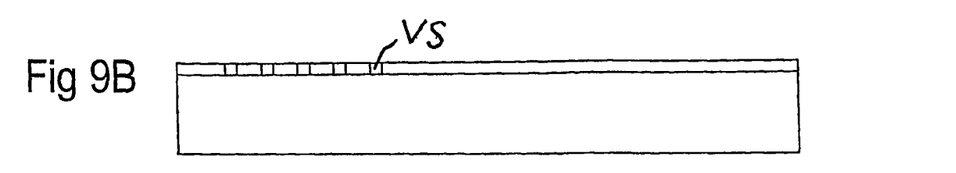

FIG. 9B shows the arrangement after the deposition of a metal selectively in the openings OE. This can be done for example by selective tungsten deposition exclusively in the interior of the openings. However, it is also possible to deposit a metal over the whole area and to etch back the arrangement in planar fashion or to planarize it by means of chemical mechanical polishing.

Figure 9C:
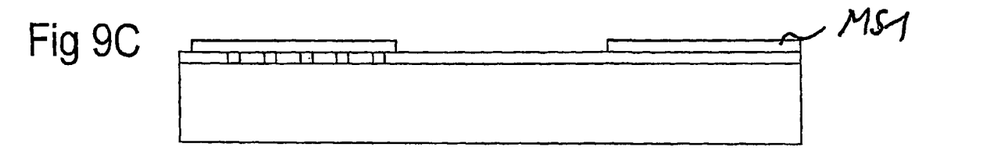

In the next step, a first metal layer MS1 is applied over the whole area and patterned, such that a metal area remains in the region of the stack above the connecting structures VS and in the region of a later mass loading ML. FIG. 9C shows the arrangement at this method stage.

Figure 9D:
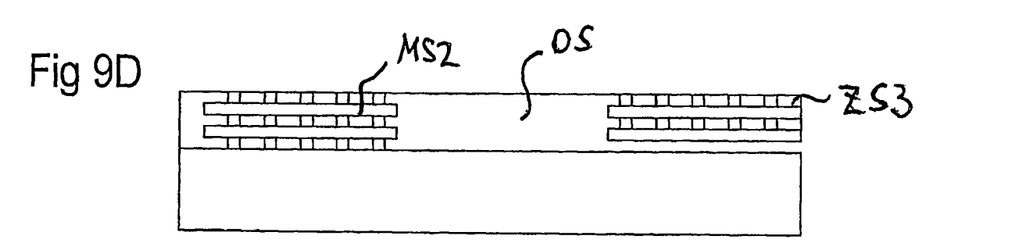

Afterwards, interlayers ZS including connecting structures VS arranged therein and also further metal layers MS are produced alternately until the multilayer construction comprising three interlayers and two metal layers arranged in between in FIG. 9D is obtained. Between the stack (illustrated on the left in the figure) defined areally by the size of the metal layers and the construction for the mass loading (illustrated on the right in the figure), said construction being separated from the substrate surface by a sacrificial layer, the interspace outside the stack is filled with further sacrificial material, for example silicon oxide, such that a planar surface of the construction that terminates with the surface of the third interlayer ZS3 of the multilayer construction is obtained. FIG. 9D shows the arrangement at this method stage.

Figure 9E:
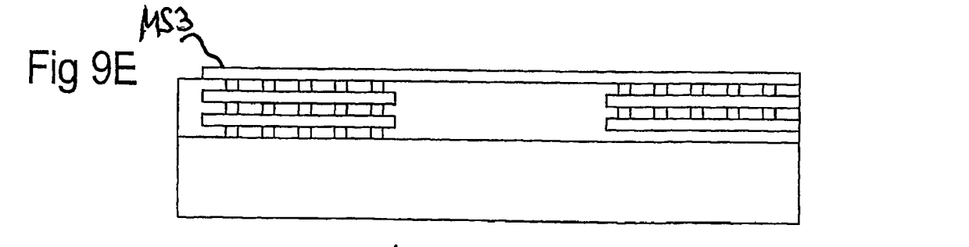

The metal layer lengthened to form the membrane (the third metal layer MS3 in the figure) is subsequently produced. Since said metal layer is embedded at least into a lower and an upper passivation layer, firstly a first passivation layer, then the metal layer and finally a second passivation layer are produced and patterned. The patterning can be effected separately for each individual layer, but can also be carried out in a single step using a single mask. FIG. 9E shows the arrangement with a finished third metal layer MS3 lengthened to form the membrane, although the relatively thin passivation layers are not depicted therein.

Figure 9F:
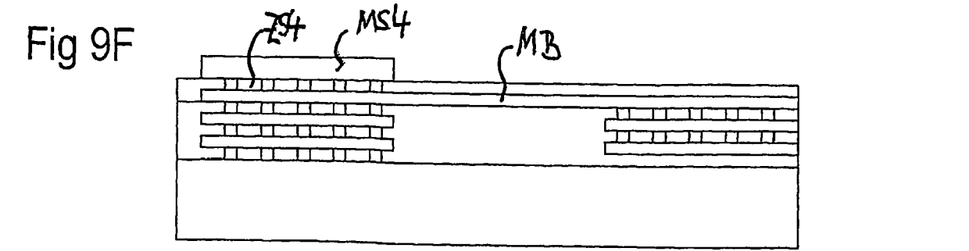

Afterwards, the multilayer construction in the region of the stack is supplemented by further layers, here by a fourth interlayer ZS4 and a fourth metal layer MS4. In the region of the stack, all the metal layers are then electrically connected to one another by the connecting structures in the interlayers ZS, the stability of the stack also being increased simultaneously. The fourth interlayer ZS4 also extends above the membrane MB, where it serves later as a sacrificial layer. FIG. 9F shows the arrangement at this method stage.

Figure 9G:
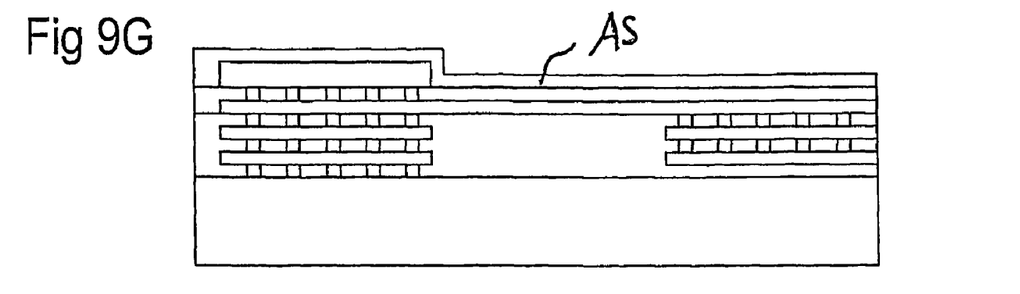
Figure 9H:
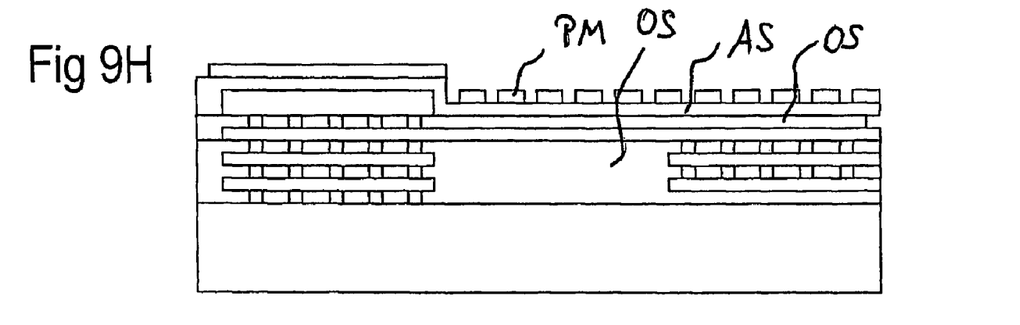

In the next step, a covering layer AS is deposited over the whole area, the later covering being patterned from said layer. The covering layer can comprise any mechanically stable dielectric material, for example nitride and in particular silicon nitride. With the aid of a photoresist mask, the covering layer AS is then etched in a first step and the hole pattern is produced there. This is followed by an etching of the sacrificial layers, which comprise in particular the same material as the interlayers ZS, and are formed in particular from oxide.

Figure 9I:
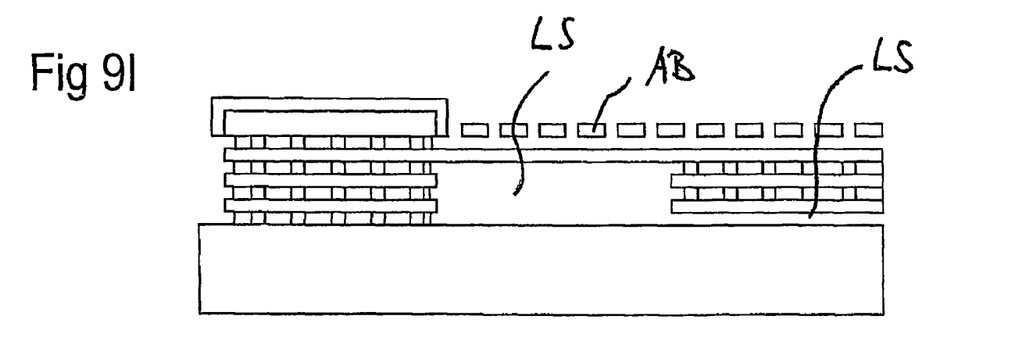

Said etching can be carried out in two steps, wherein firstly etching is effected anisotropically in extension of the hole pattern in the photoresist mask into the oxide, the etching being stopped in the oxide or at the substrate surface. This is done both in the region of the air gap below the membrane and in the region of the mass loading, below which a sacrificial layer to be removed is likewise situated. In a second etching step, isotropic etching is subsequently effected in order to widen the vertical etching holes laterally into the dielectric of the sacrificial layer and finally unite them to form a single continuous cavity or air gap. The etching is carried out until all the sacrificial material has been removed. FIG. 9I shows the arrangement in which corresponding air gaps LS have been produced below the membrane and between membrane and covering. In addition, in the region of the air gaps, the sacrificial material is also removed outside the stack, but the patterning can be conducted in such a way that suitable supporting elements remain for the covering (not illustrated in the figure). The photomask is removed after the etching step.

Figure 9J:
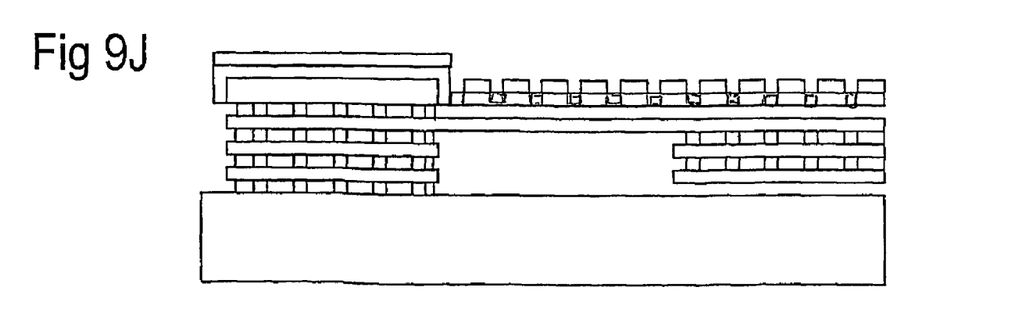

If the covering is intended to enable air and pressure equalization with the surroundings, then the method is ended at this juncture similar in this regard to the arrangement of FIG. 1. However, if a closed covering AB is desired or required, then in a concluding step a further covering layer is produced over the whole area above the patterned covering layer, by means of which the hole pattern is closed off. FIG. 9J shows a portion of a component finished after this method stage in the region of stack and membrane, similar to the arrangement of FIG. 2.

It holds true for each individual layer that the materials and methods used therefor are preferably compatible with standard methods of CMOS technology. Accordingly, the layer thicknesses are also chosen within the range of the layer thicknesses that are customarily used in CMOS technology.

The quality of the multilayer construction increases with the planarity of the layers. If the respective layer deposition method does not lead to a planar surface, the surface can subsequently also be planarized, for example by chemical mechanical polishing (CMP) or by auxiliary layers which produce a planarization and are then etched back at the same etching rate as the layer to be levelled. All interspaces that are later filled with air are filled with sacrificial material during production, for which purpose the material of the interlayers is preferably used. In the region of later air gaps, a hole pattern is produced continuously through all layers not composed of sacrificial material, in order to enable the unimpeded access of etchant from above. For etching oxide, in particular, it is possible to use dry/anhydrous or gaseous hydrofluoric acid, which enables a rapid removal of oxidic sacrificial layers. However it is also possible to use plasma etching methods. Furthermore, it is possible to combine a plasma etching method as anisotropic etching step and a "wet etching method" as isotropic etching step. It is also possible to use organic layers as sacrificial layers, and then to remove them in an oxygen plasma. In the construction proposed, organic dielectrics can also be used for the interlayer.

The lateral passivation layers can be produced by means of a spacer technique at least in the region of the membrane MB. However, it is also possible to correspondingly pattern the upper passivation layer above the membrane such that it only overlaps laterally, as is illustrated for example in FIG. 8.

The invention has been illustrated only on the basis of some exemplary embodiments, but is not restricted to them. The exact number of layers used for the multilayer construction and the arrangement of the membrane within said layer construction are unimportant for the invention. However, symmetrical or approximately symmetrical constructions are always preferred, such that the membrane is situated in the "middle" of the multilayer construction. With regard to the materials used, there is extensive selection freedom for the function of the component, but in this case the corresponding compatibility should be taken into consideration or is advantageous.

The substrate material can be a carrier material or a semiconductor component which comprises a circuit arrangement, that is to say an integrated circuit. Method steps known per se can be used for individual steps or for a large part of the construction proposed. What is always essential, however, is that the stacks of the multilayer construction comprise at least two metal layers, of which the metal layer lengthened to form the membrane constitutes an upper layer. The abovementioned matching and passivation layers which positively influence the properties of the finished component are also advantageous.

The invention is not restricted to the description with the aid of the exemplary embodiments. Rather, the invention comprises each new feature and each combination of features, which includes, in particular, each combination of features in the patent claims, even when this feature or this combination is not itself explicitly specified in the patent claims or exemplary embodiments.

The invention claimed is:

1. A micromechanical component, comprising:
a substrate;
at least one electrical circuit arrangement in or on said substrate; and
a first stack applied on said substrate, wherein said first stack includes a multilayer construction comprising an alternate sequence of patterned metal layers and interlayers, and having at least two of said metal layers;
wherein one of said metal layers of said multilayer construction other than a bottommost metal layer and an uppermost metal layer is lengthened beyond said first stack at one side thereof and comprises a freely vibratable, electrically conductive membrane; and
wherein said electrically conductive membrane is applied on a dielectric interlayer of said interlayers, and
wherein the membrane is formed in reed-type fashion and has a mass loading at a free end opposite to the first stack, the mass loading comprising a plurality of layers, including at least two metal layers, and the plurality of layers being positioned above the membrane, below the membrane, or both above and below the membrane.

2. The component according to claim 1, in which the interlayers comprise a dielectric into which electrically conductive connecting structures are embedded in such a way that there is an electrically conductive connection between the circuit arrangement, the metal layers and the membrane.

3. The component according to claim 1, in which the circuit arrangement in the substrate comprises an integrated circuit arrangement.

4. The component according to claim 1, in which the substrate is an IC component comprising an integrated circuit for operating a sensor.

5. The component according to claim 1, in which at least two further metal layers and at least three interlayers arranged alternately with respect thereto are arranged in the stack below the metal layer lengthened to form the membrane.

6. The component according to claim 1, in which at least the metal layer lengthened to form the membrane is embedded between an upper and a lower passivation layer.

7. The component according to claim 6, in which at least one layer selected from dielectric and passivation layers comprises titanium nitride.

8. The component according to claim 6, in which the upper passivation layer has a different layer thickness from the lower passivation layer at least at the freely vibrating membrane for the purpose of stress compensation.

9. The component according to claim 1, in which the membrane has a pattern of perforations.

10. The component according to claim 1,
in which a first and a second stack with identical multilayer construction are provided, and
in which the membrane is formed in reed-type fashion and comprises a metal layer which is associated with both stacks and which can vibrate freely between the stacks.

11. The component according to claim 1, in which spacer structures are adjacent to the lateral edges of the multilayer construction.

12. The component according to claim 1, in which the metal layers comprise aluminium or copper.

13. The component according to claim 1, in which the dielectric is selected from an oxide, a nitride or an oxynitride.

14. The component according to claim 1, in which a covering is provided above the membrane at a distance from the latter.

15. The component according to claim 14, in which the covering has continuous holes.

16. The component according to claim 1, in which an electrode is arranged below the freely vibrating membrane in or on the substrate, said electrode forming a capacitance with respect to the membrane, and
in which the circuit arrangement is designed to generate a measurement signal proportional to said capacitance.

17. The component according to claim 1, in which a stress compensation layer is provided on or above the membrane.

18. A method for producing a micromechanical component according to claim 1, comprising the steps of:
producing a multilayer construction in stack form, comprising an alternate sequence of patterned metal layers and interlayers;
patterning a metal layer other than the bottommost metal layer of the patterned multilayer construction as a membrane projecting beyond the stack on one side;
patterning each layer after deposition;
producing a sacrificial layer between the structures of the individual layers, said sacrificial layer filling at least the space between membrane and substrate;
patterning a pattern of perforations in the membrane by etching;
embedding at least the membrane between an upper and a lower passivation layer; and
removing the sacrificial layer by etching at least above and below the membrane.

19. The method according to claim 18, comprising:
producing an upper sacrificial layer above the multilayer construction;
depositing a covering layer above said upper sacrificial layer;
providing holes in said covering layer, and
removing the upper sacrificial layer by means of etching through the holes in the covering layer.

20. The method according to claim 18 comprising:
producing an auxiliary layer after the production and patterning of the multilayer construction; and
producing spacer structures from said auxiliary layer by anisotropic etching back.

21. The method according to claim 18, comprising:
depositing dielectric layers for the interlayers;
producing a hole pattern in the dielectric layers by etching; and
filling the hole pattern wuth tungsten by selective metal deposition.

22. The component according to claim 1, wherein said electrically conducting membrane is applied on the dielectric interlayer with no intervening ones of said metal layers and interlayers.

23. A method for measuring an acceleration or a pressure, or for producing a microphone, wherein the method is comprised of providing the component according to claim 1 as a microsensor.

24. A method for fabricating an electrostatic switch comprised of providing the component according to claim 1.

\* \* \* \* \*